United States Patent
Lin et al.

(10) Patent No.: US 7,713,769 B2
(45) Date of Patent: *May 11, 2010

(54) METHOD FOR FABRICATING LIGHT EMITTING DIODE STRUCTURE HAVING IRREGULAR SERRATIONS

(75) Inventors: Hung-Cheng Lin, Taipei County (TW); Chia-Ming Lee, Yilan County (TW); Jen-Inn Chyi, Taoyuan County (TW)

(73) Assignee: Tekcore Co., Ltd., Nantou (TW)

( * ) Notice: Subject to any disclaimer, the term of this patent is extended or adjusted under 35 U.S.C. 154(b) by 56 days.

This patent is subject to a terminal disclaimer.

(21) Appl. No.: 11/963,558

(22) Filed: Dec. 21, 2007

(65) Prior Publication Data

US 2009/0159910 A1    Jun. 25, 2009

(51) Int. Cl.
*H01L 21/46* (2006.01)
*H01L 21/461* (2006.01)
*H01L 21/8252* (2006.01)
*H01L 27/15* (2006.01)

(52) U.S. Cl. ............. 438/29; 438/39; 438/40; 438/41; 438/42; 438/43; 438/44; 257/79; 257/103; 257/E33.074; 313/498

(58) Field of Classification Search ............ 438/29, 438/39–44; 257/79
See application file for complete search history.

(56) References Cited

U.S. PATENT DOCUMENTS

| 7,075,115 B2 | 7/2006 | Sakamoto et al. | |
|---|---|---|---|
| 2005/0082562 A1* | 4/2005 | Ou et al. | 257/103 |
| 2007/0190676 A1* | 8/2007 | Chu et al. | 438/22 |
| 2008/0035936 A1* | 2/2008 | Lester | 257/79 |
| 2008/0044937 A1* | 2/2008 | Choi et al. | 438/47 |
| 2008/0067916 A1* | 3/2008 | Hsu et al. | 313/498 |
| 2008/0142814 A1* | 6/2008 | Chu et al. | 257/79 |

* cited by examiner

*Primary Examiner*—N Drew Richards
*Assistant Examiner*—Michael Jung
(74) *Attorney, Agent, or Firm*—Muncy, Geissler, Olds & Lowe, PLLC

(57) ABSTRACT

The present invention discloses a light emitting diode structure and a method for fabricating the same. In the present invention, a substrate is placed in a solution to form a chemical reaction layer on carved regions; the carved region is selectively etched to form a plurality of concave zones and form a plurality of convex zones; a semiconductor layer structure is epitaxially grown on the element regions and carved regions of the substrate; the semiconductor layer structure on the element regions is fabricated into a LED element with a photolithographic process.

9 Claims, 3 Drawing Sheets

METHOD FOR FABRICATING LIGHT EMITTING DIODE STRUCTURE HAVING IRREGULAR SERRATIONS

FIELD OF THE INVENTION

The present invention related to a light emitting diode structure and a method for fabricating the same, particularly to a light emitting diode structure and a method for fabricating the same, wherein concave zones and convex zones are formed on the surface of each carved region.

BACKGROUND OF THE INVENTION

Improving LED (Light Emitting Diode) light efficiency is a top priority for realizing a solid-state illuminator. There are two approaches to improve LED light efficiency: one is to increase LED internal quantum efficiency, and the other is to increase LED external quantum efficiency (LED light extraction efficiency).

There is a great difference between the refractive indexes of a semiconductor and a packaging material; therefore, a LED usually has a small total reflection critical angle. The light generated by LED reaching an interface by an angle greater than the total reflection critical angle will be totally reflected back to the interior of the LED chip. Then, the probability that light leaves a semiconductor from an interface decreases, and photons can only be totally reflected inside a chip until they are completely absorbed and converted into heat. Thus, LED has an insufficient light efficiency.

Changing the geometry of LED is an effective measure to improve LED light efficiency. A U.S. Pat. No. 7,075,115 disclosed a semiconductor light emitting element, which has a concave and convex structure formed on the border of the LED element. Compared with the planar surface of another LED element, the concave and convex structure can scatter or diffract the horizontally-propagating light and thus can greatly promote external quantum efficiency.

In the abovementioned conventional technology, the fabrication process of the concave and convex structure includes: forming a passivation layer on the surface of the semiconductor layer of the LED; patterning the geometry of the concave and convex structure on the passivation layer with a photolithographic process; and etching the semiconductor layer of the LED to form the concave and convex structure with a dry- or wet-etching method. However, such a process is more complicated and cost-inefficient, which will impair the commercialization of LED.

SUMMARY OF THE INVENTION

The present invention provides a light emitting diode structure and a method for fabricating the same, wherein a chemical reaction layer is formed on the carved regions of the substrate; the carved regions are etched to form irregular serrations on the surfaces thereof with a dry-etching or wet-etching method and with the chemical reaction layer being a natural etching mask; a light emitting diode element is epitaxially grown with serrated surfaces naturally formed on the border thereof, whereby the external quantum efficiency is increased, and commercial mass production is benefited.

The method for fabricating a light emitting diode of the present invention comprises: providing a substrate, forming a passivation layer on the substrate, patterning the passivation layer to define element regions covered by the passivation layer and carved regions where the surface of the substrate is exposed, wherein the substrate is made of sapphire, silicon carbide, silicon, gallium arsenide, aluminum nitride, or gallium nitride; placing the substrate in a first solution to form a high-density chemical reaction layer on the surface of the carved regions where the surface of the substrate is exposed; selectively etching the carved regions with a dry-etching or wet-etching method and with the passivation layer and the chemical reaction layer being a mask to form a plurality of concave zones on the carved regions without the chemical reaction layer and form a plurality of convex zones with the chemical reaction layer overhead; placing the substrate in a second solution to remove the chemical reaction layer to make the surface of the carved regions of the substrate have an irregular geometry of the concave zones and convex zones; removing the passivation layer, and thoroughly clean the surface of the substrate; epitaxially growing a semiconductor layer structure on the element regions and the carved regions with the semiconductor layer structure on the carved regions having a plurality of semiconductor concave zones and a plurality of semiconductor convex zones; and fabricating the semiconductor layer structure on the element regions into light emitting diode elements with a photolithographic process.

The semiconductor layer structure is formed via epitaxially forming at least one n-type semiconductor layer, an active layer, and at least one p-type semiconductor layer sequentially, wherein the active layer functions as a light emitting layer and is interposed between the n-type semiconductor layer and the p-type semiconductor layer. Via a photolithographic process, the semiconductor layer structure on the element region is fabricated into a LED element, and the p-type semiconductor layer is electrically coupled to a p-type ohmic contact electrode, and the n-type semiconductor layer is electrically coupled to an n-type ohmic contact electrode, to provide a forward bias for the LED element. The semiconductor layer structure on the carved regions is etched to such an extend that only the n-type semiconductor layer remains, and the surface of the n-type semiconductor layer has a plurality of semiconductor concave zones and a plurality of semiconductor convex zones.

Either of the first solution and the second solution is a solution selected from a group consisting of acidic solutions, or a group consisting of basic solutions, or a mixed solution selected from a group consisting of acidic solutions or a group consisting of basic solutions. The acidic solution group consists of hydrofluoric acid (HF), sulfuric acid ($H_2SO_4$), hydrochloric acid (HCl), phosphoric acid ($H_3PO_4$), nitric acid ($HNO_3$), aqua regia, buffered oxide etch (BOE), Al Etchant, hydrogen peroxide ($H_2O_2$), formic acid (HCOOH), acetic acid ($CH_3COOH$), succinic acid ($C_4H_6O_4$), and citric acid. The basic solution group consists of potassium hydroxide (KOH), sodium hydroxide (NaOH), calcium hydroxide (Ca$(OH)_2$), ammonium hydroxide ($NH_4OH$), and tetramethylammonium hydroxide (TMAH).

In the present invention, the substrate is placed in the first solution for from 1 second to 200 minutes, and the substrate is also placed in the second solution for from 1 second to 200 minutes. The convex zone is higher than the concave zone by from 0.1 μm to 15 μm.

In the LED structure fabricated according to the abovementioned method, the surface of a substrate is divided into element regions and carved regions. Irregular concave zones and convex zones are formed on the surface of the carved regions. A semiconductor layer structure is epitaxially grown on the element regions and carved regions of the substrate. An LED element is formed in the semiconductor layer structure on the element region with a photolithographic process.

The advantage of the present invention is to use a novel process to form a chemical reaction layer on the carved regions, and use the chemical reaction layer as a natural etching mask to form an irregular geometry of serrations on the carved regions via a dry- or wet-etching method. Then, a semiconductor light emitting element is epitaxially grown with irregular serrations naturally formed on the border of the semiconductor light emitting element. The light generated by the LED element will be scattered or diffracted by the irregular serrations. Thus, the horizontal light propagation between the substrate and the semiconductor layers is decreased, and the total reflection is reduced, and the light extraction efficiency of the LED element is increased. Further, the present invention has a simple process and thus can reduce fabrication cost and benefit mass-production.

DETAILED DESCRIPTION OF THE PREFERRED EMBODIMENTS

The technical contents of the present invention will be described with the embodiments. However, it should be noted that the embodiments are only to exemplify the present invention but not to limit the scope of the present invention.

Figure 1:
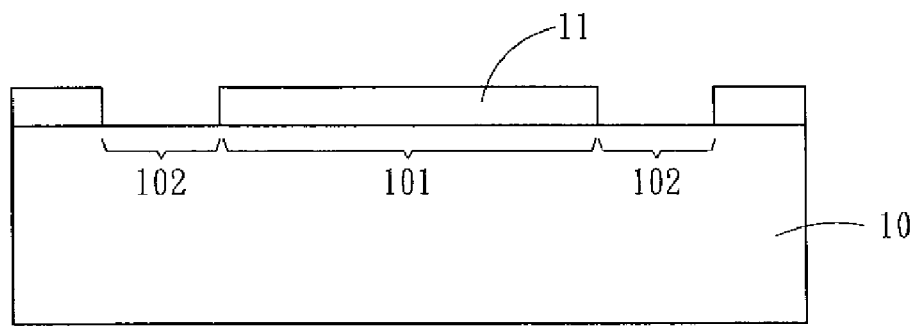
FIG. 1 is a diagram schematically showing that a passivation layer is formed and patterned on a substrate according to the present invention.

Refer to from FIG. 1 to FIG. 5. In the method for fabricating a light emitting diode structure of the present invention, a substrate 10 is provided firstly. The substrate 10 may be made of sapphire ($Al_2O_3$), silicon carbide (SiC), silicon (Si), gallium arsenide (GaAs), aluminum nitride (AlN), or gallium nitride (GaN). A passivation layer 11 is grown on the surface of the substrate 10. The passivation layer 11 is patterned to define element regions 101 covered by the passivation layer 11, and carved regions 102 where the surface of the substrate 10 is exposed, as shown in FIG. 1.

Figure 2:
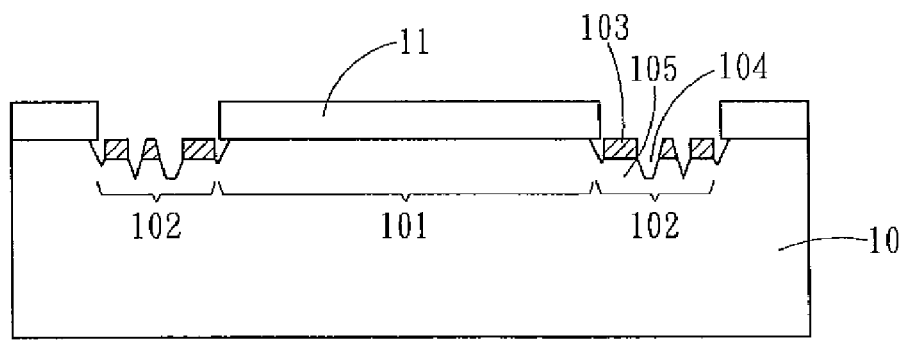
FIG. 2 is a diagram schematically showing that a chemical reaction layer is formed on the surface of the substrate, and that an etching is performed with the chemical reaction layer being a natural etching mask according to the present invention.
Figure 3:
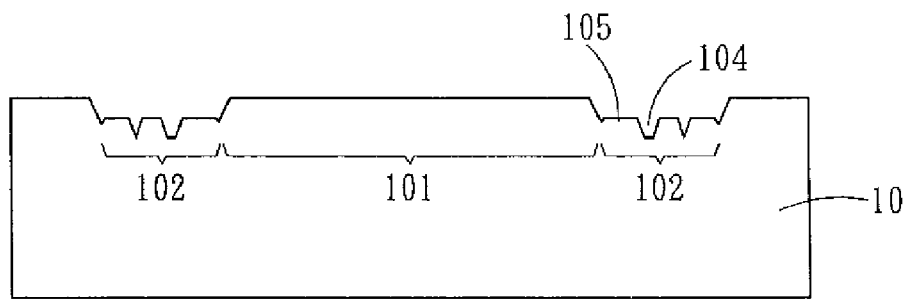
FIG. 3 is a diagram schematically showing that concave zones and convex zones are formed on carved regions according to the present invention.

Next, the substrate 10 is placed in a first solution for chemical reaction, and a high-density chemical reaction layer 103 naturally forms on the surface of the substrate 10 in the carved regions 102. The substrate 10 should be placed in the first solution for from 1 second to 200 minutes. Next, with the passivation layer 11 and the chemical reaction layer 103 being a mask, the carved regions 102 of the substrate 10 are selectively etched to form a plurality of concave zones 104 on the carved regions without the chemical reaction layer 103 and form a plurality of convex zones 105 on the carved regions with the chemical reaction layer 103 overhead, as shown in FIG. 2.

Thereinafter, a sapphire ($Al_2O_3$) substrate will be used to exemplify the substrate 10. A sapphire ($Al_2O_3$) substrate is placed in a 96% sulfuric acid ($H_2SO_4$) solution (the first solution) at a temperature of between 25 and 400° C. for from 1 second to 200 minutes. A high-density nanometric chemical reaction layer 103 ($Al_2(SO_4)_3$, or $Al_2(SO_4).17H_2O$, etc.) is thus formed on the carved regions 102 of the substrate 10. Then, with the chemical reaction layer 103 being a mask, the substrate 10 is selectively etched with a dry-etching method or a wet-etching method.

Thus, concave zones 104 and convex zones 105 are formed on the sapphire ($Al_2O_3$) substrate. When the sapphire substrates are respectively placed in the first solution (such as sulfuric acid) for from 2.5 to 20 minutes, the substrates will respectively have different average etching depths, different average grain sizes, different densities and different RMS roughnesses. The results observed with an atomic force microscope are shown in the table below.

| Etching Time (min) | Average Etching Depth (μm) | Average Grain Size (μm) | Density (1/μm$^2$) | RMS Roughness (nm) |
|---|---|---|---|---|
| 2.5 | 0.360 | 5.36 | 0.0092 | 106.24 |
| 5.0 | 0.683 | 6.04 | 0.0096 | 207.30 |
| 10.0 | 1.759 | 12.30 | 0.0108 | 471.15 |
| 20.0 | 2.351 | 15.03 | 0.0080 | 700.77 |

Next, the substrate 10 is placed in a second solution to remove the chemical reaction layer 103 and form the irregular concave zones 104 and convex zones 105 on the carved regions 102 of the substrate 10. When the second solution is exemplified by phosphoric acid ($H_3PO_4$), the chemical reaction layer 103 can be thoroughly cleaned via placing the substrate 10 in phosphoric acid at a temperature of between 25° C. and 400° C. for from 1 second to 200 minutes. Then, the passivation layer 11 is also removed, and the surface of the substrate 10 is cleaned to maintain the planarity of the element regions 101 of the substrate 10.

Figure 4:
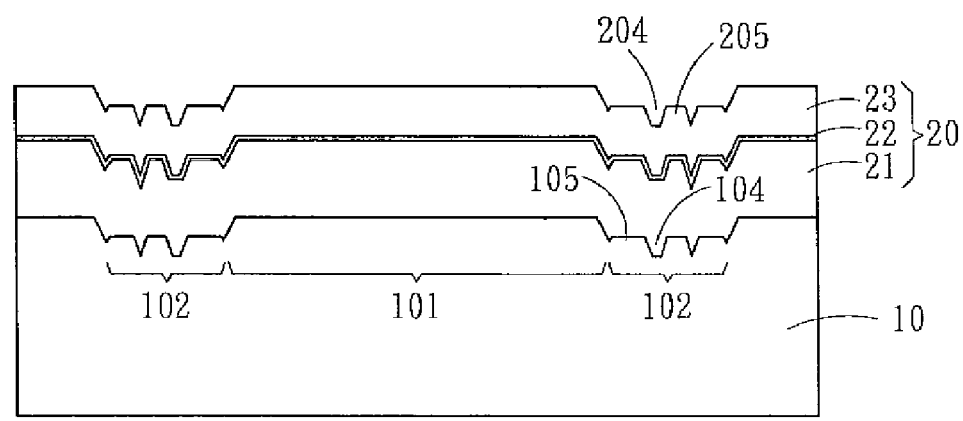
FIG. 4 is a diagram schematically showing that a semiconductor layer structure is epitaxially formed on the substrate according to the present invention.
Figure 5:
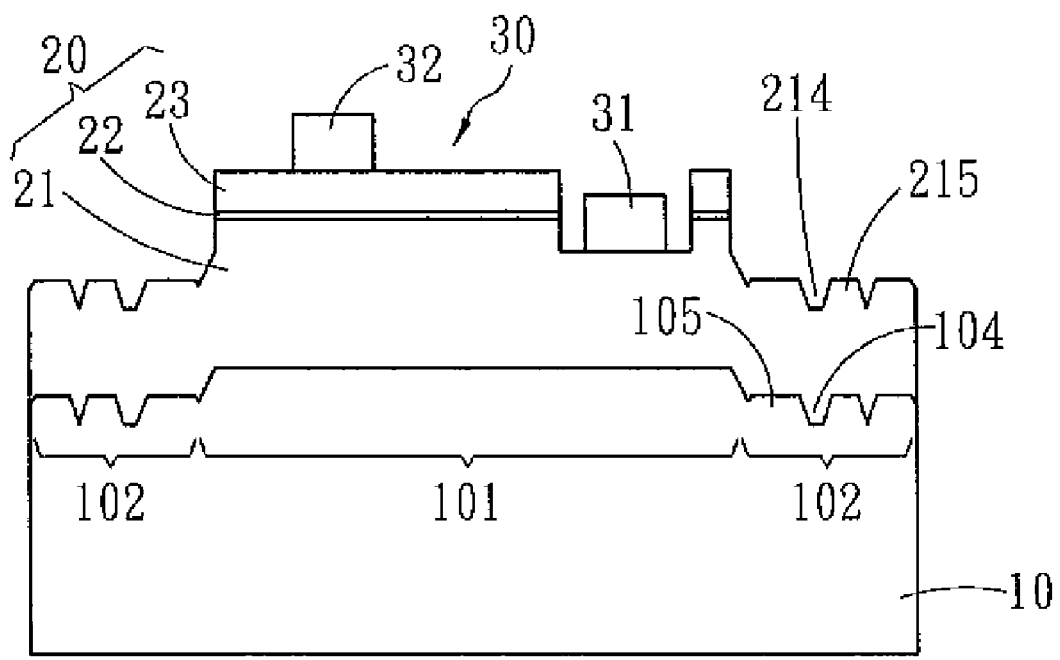
FIG. 5 is a diagram schematically showing an LED structure according to the present invention.

Next, an LED semiconductor layer structure 20 is formed on the surface of the element region 101 of the substrate 10. The semiconductor layer structure 20 is formed via epitaxially forming at least one n-type semiconductor layer 21, an active layer 22, and at least one p-type semiconductor layer 23 sequentially, wherein the active layer 22 functions as a light emitting layer and is interposed between the n-type semiconductor layer 21 and the p-type semiconductor layer 23, as shown in FIG. 4. The planarity of the semiconductor layer structure 20 will be maintained on the element regions 101 of the substrate 10. The semiconductor layer structure 20 on the carved regions 102, including: the n-type semiconductor layer 21, the active layer 22 and the p-type semiconductor layer 23, will be roughened by the irregular concave zones 104 and convex zones 105 to form a plurality of semiconductor concave zones 204 and a plurality of semiconductor convex zones 205.

Next, via a photolithographic process, the semiconductor layer structure 20 on the element region 101 is fabricated into an LED element 30. The p-type semiconductor layer 23 is electrically coupled to a p-type ohmic contact electrode 32, and the n-type semiconductor layer 21 is electrically coupled to an n-type ohmic contact electrode 31 via a contact window, to provide a forward bias for the LED element 30. The semiconductor layer structure 20 on the carved regions 102 is etched to such an extend that only the n-type semiconductor layer 21 remains, and the surface of the n-type semiconductor layer 21 has a plurality of semiconductor concave zones 214 and a plurality of semiconductor convex zones 215.

The light emitted by the active layer 22 will be scattered or diffracted by the concave zones 104 and convex zones 105 of the substrate 10 and the semiconductor concave zones 214 and semiconductor convex zones 215 on the n-type semiconductor layer 21. Thus, the probability of total reflection is reduced, and the light extraction efficiency of the LED element 30 is promoted, and total light output is increased.

The LED structure fabricated according to the abovementioned method comprises a substrate 10. The surface of the substrate 10 is divided into element regions 101 and carved regions 102. Irregular concave zones and convex zones are formed on the surface of the carved regions 102. A semiconductor layer structure 20 is epitaxially grown on the element regions 101 and carved regions 102 of the substrate 10. A plurality of semiconductor concave zones 204 and a plurality of semiconductor convex zones 205 are formed on the semiconductor layer structure 20 on the surface of the carved regions 102. An LED element 30 is formed on the semiconductor layer structure 20 on the element region 101 via a photolithographic process. The semiconductor layer structure 20 on the carved regions 102 is etched to such an extend that only the n-type semiconductor layer 21 remains, and the surface of the n-type semiconductor layer 21 has a plurality of semiconductor concave zones 214 and a plurality of semiconductor convex zones 215.

The spirit of the present invention is to form the chemical reaction layer 103 on the carved regions 102, and selectively etch the carved regions 102 to form the concave zones 104 and convex zones 105 on the surface thereof and grow the semiconductor layer structure 20 on the carved regions 102 with irregular serrations naturally formed on the surface of the semiconductor layer structure 20. The light generated by the LED element 30 will be scattered or diffracted by the concave zones 104 and convex zones 105 and the semiconductor concave zones 214 and semiconductor convex zones 215. Thus, the horizontal light propagation between the substrate 10 and the n-type semiconductor layer 21 is reduced, the total reflection is decreased, and the light extraction efficiency of the LED element 30 is increased.

The preferred embodiments described above are only to exemplify the present invention but not to limit the scope of the present invention. Any equivalent modification or variation according to the spirit of the present invention is to be also included within the scope of the present invention.

What is claimed is:

1. A method for fabricating a light emitting diode structure comprising:
    providing a substrate, forming a passivation layer on said substrate, patterning said passivation layer to define element regions covered by said passivation layer and carved regions where the surface of said substrate is exposed;
    placing said substrate in a first solution to form a high-density chemical reaction layer on the surface of said carved regions;
    selectively etching said carved regions with said passivation layer and said chemical reaction layer being a mask to form a plurality of concave zones on said carved regions without said chemical reaction layer and form a plurality of convex zones with said chemical reaction layer overhead;
    placing said substrate in a second solution to remove said chemical reaction layer to make the surface of said carved regions of said substrate form an irregular geometry composed of said concave zones and said convex zones, wherein the irregular geometry corresponds to the mask of said chemical reaction layer;
    removing said passivation layer, and thoroughly clean the surface of said substrate;
    epitaxially growing a semiconductor layer structure on said element regions and said carved regions with said semiconductor layer structure on said carved regions having a plurality of semiconductor concave zones and a plurality of semiconductor convex zones; and
    fabricating said semiconductor layer structure on said element regions into light emitting diode elements via a photolithographic process.

2. The method for fabricating the light emitting diode structure according to claim 1, wherein said substrate is made of sapphire, gallium arsenide, aluminum nitride, or gallium nitride.

3. The method for fabricating the light emitting diode structure according to claim 1, wherein said first solution or said second solution is one solution selected from a group consisting of acidic solutions, or a group consisting of basic solutions, or a mixed solution selected from said group consisting of acidic solutions, or said group consisting of basic solutions.

4. The method for fabricating the light emitting diode structure according to claim 3, wherein said group consisting of acidic solutions includes: hydrofluoric acid (HF), sulfuric acid ($H_2SO_4$), hydrochloric acid (HCl), phosphoric acid ($H_3PO_4$), nitric acid ($HNO_3$), aqua regia, buffered oxide etch (BOE), Al Etchant, hydrogen peroxide ($H_2O_2$), formic acid (HCOOH), acetic acid ($CH_3COOH$), succinic acid ($C_4H_6O_4$), and citric acid.

5. The method for fabricating the light emitting diode structure according to claim 3, wherein said group consisting of basic solutions includes: potassium hydroxide (KOH), sodium hydroxide (NaOH), calcium hydroxide ($Ca(OH)_2$), ammonium hydroxide ($NH_4OH$), and tetramethylammonium hydroxide (TMAH).

6. The method for fabricating the light emitting diode structure according to claim 1, wherein said substrate is placed in said first solution for from 1 second to 200 minutes.

7. The method for fabricating the light emitting diode structure according to claim 1, wherein said substrate is placed in said second solution for from 1 second to 200 minutes.

8. The method for fabricating the light emitting diode structure according to claim 1, wherein the height difference between said concave zones and said convex zones is from 0.1 to 15 μm.

9. The method for fabricating the light emitting diode structure according to claim 1, wherein said semiconductor layer structure is formed via epitaxially forming at least one n-type semiconductor layer, an active layer, and at least one p-type semiconductor layer sequentially, and said active layer functions as a light emitting layer and is interposed between said n-type semiconductor layer and said p-type semiconductor layer; via a photolithographic process, said p-type semiconductor layer on said element region is electrically coupled to a p-type ohmic contact electrode, and said n-type semiconductor layer on said element region is electrically coupled to an n-type ohmic contact electrode, to provide a forward bias for said light emitting diode element; said semiconductor layer structure on said carved region is etched to such an extend that only said n-type semiconductor layer remains, and the surface of said n-type semiconductor layer has a plurality of semiconductor concave zones and a plurality of semiconductor convex zones.

* * * * *